United States Patent
Tseng

[11] Patent Number: 6,093,621
[45] Date of Patent: *Jul. 25, 2000

[54] METHOD OF FORMING SHALLOW TRENCH ISOLATION

[75] Inventor: Horng-Huei Tseng, Hsinchu, Taiwan

[73] Assignee: Vanguard International Semiconductor Corp., Hsinchu, Taiwan

[ * ] Notice: This patent is subject to a terminal disclaimer.

[21] Appl. No.: 09/286,354

[22] Filed: Apr. 5, 1999

[51] Int. Cl.⁷ .................................................. H01L 21/76

[52] U.S. Cl. .................. 438/424; 438/427; 438/435; 438/437; 148/DIG. 50

[58] Field of Search ................................... 438/424, 427, 438/435, 437; 148/DIG. 50

[56] References Cited

U.S. PATENT DOCUMENTS

| | | | |
|---|---|---|---|
| 5,940,716 | 8/1999 | Jin et al. | 438/424 |
| 5,960,297 | 9/1999 | Saki | 438/296 |
| 5,963,819 | 10/1999 | Lan | 438/424 |
| 5,976,948 | 11/1999 | Werner et al. | 438/424 |
| 5,981,356 | 11/1999 | Hsueh et al. | 438/424 |
| 5,989,975 | 11/1999 | Kuo | 438/424 |

*Primary Examiner*—Trung Dang
*Attorney, Agent, or Firm*—J.C. Patents; Jiawei Huang

[57] ABSTRACT

A method of fabricating a shallow trench isolation. A pad oxide and a dielectric layer are formed on a substrate. A trench is formed in the substrate penetrating through the pad oxide layer and the dielectric layer. The dielectric layer around the edge of the trench is removed to expose the substrate. The trench is filled to form a T-shaped insulation plug.

20 Claims, 3 Drawing Sheets

METHOD OF FORMING SHALLOW TRENCH ISOLATION

BACKGROUND OF THE INVENTION

1. Field of the Invention

The invention relates in general to a method of forming an integrated circuit and more particularly to a method of forming a shallow trench isolation (STI).

2. Description of the Related Art

In the very advanced fabrication technology of integrated circuits to reduce the dimensions of devices and to increase the integration are a leading trend and topic for further development. However, as the dimensions of devices shrink, the isolation structures between devices have to shrink as well. It is thus to cause a problem and difficulty in fabrication. Isolation structure such as a field oxide formed by local oxidation (LOCOS) has been widely used in the conventional fabrication process. Due to the consequently caused characteristics such as a bird's beak. This technique cannot meet the requirement for higher integration. Other structure such as a shallow trench isolation has been used instead of the field oxide layer, especially in sub-half micron fabrication process.

To fabricate a shallow trench isolation, a nitride layer is commonly used as a hard mask layer on a substrate. Using anisotropic etching, a trench is formed in the substrate. An oxide plug is then filled in the trench to form the shallow trench isolation. In the conventional method, it is inevitable that a recess occurs around the edge of the oxide plug to cause a corner effect. In the subsequent process, such as using ion implantation to form a source/drain region of a transistor in the substrate, the implanted charged ion would accumulate in the recess around edge. An abnormal sub-threshold current is caused in a channel region of the transistor due to accumulated charges. That is, a kink effect is caused. The corner effect has been further discussed by Geissler, Poth, Lasky, Johnson, and Voldman in the paper "A New Three-Dimensional MOSFET Gate-Induced Drain Leakage Effect in Narrow Deep Submicron Device" published in IEEE IEDM Technical Digest, 1911.

To solve the problem of corner effect, Fazan and Pierre C. disclosed a method for fabricating a shallow trench isolation in U.S. Pat. No. 5,799,383. In this disclosure, after the formation of all oxide plug, an oxide layer is formed to cover the substrate and the oxide plug. The oxide layer is etched back to leave a spacer to cover a sidewall of the oxide plugs. Using wet etching, a pad oxide layer previously formed on the substrate is removed. However, it is known that the step of etching back the oxide layer is performed by a dry plasma etching process. Since the materials of the oxide layer and the pad oxide layer are apparently the same, the selectivity between these two layers for dry etching is so low that there is no effective way to control the etching level. As a consequence, the pad oxide layer is consequently removed while etching back the oxide layer. The substrate is very likely to be exposed under a plasma environment to be damaged by the plasma. Moreover, in the subsequently process such as an ion implantation, the substrate is directly exposed to the high energy implanted ions. The substrate is thus further damaged. Therefore, though this technique disclosed here improve the corner effect the substrate is easily damaged by directly exposed under a plasma or implanted ions.

SUMMARY OF THE INVENTION

Accordingly, the invention provides a method of fabricating a shallow trench isolation to resolve the problem of corner effect without damaging the substrate.

In the invention, a substrate covered by a pad oxide layer is provided. A dielectric layer is formed on the pad oxide layer. A photo-resist layer with an opening is formed on the dielectric layer. Using the photo-resist layer as a mask, the dielectric layer, the pad oxide layer, and the substrate are etched to form a trench. The photo-resist layer is eroded to expose a part of the dielectric layer at a periphery of the trench. The exposed dielectric layer is removed, and consequently, the trench is deepened. The photo-resist layer is removed, so that the dielectric layer, the substrate at the periphery of the trench, and a surface of the trench are exposed. An insulation layer is formed to fill the trench and to cover the exposed substrate at the periphery of the trench, so that a T-shaped insulation plug is formed. The dielectric layer is removed.

By the above method, the insulation plug filling the trench comprises a laterally extending part over the substrate and a filling part in the substrate. The function of the extending part is similar to that of the spacer disclosed by Sazan et al. However, by the invention, an additional oxide layer and a plasma etching step for forming the spacer are not required. Instead, only by eroding the photo-resist layer until the dielectric at the periphery is exposed, the corner effect can be resolved. Thus, the drawbacks of the method disclosed by Fazan et al, can be overcome in this invention.

Both the foregoing general description and the following detailed description are exemplary and explanatory only and are not restrictive of the invention, as claimed.

DESCRIPTION OF THE PREFERRED EMBODIMENTS

Figure 1A:
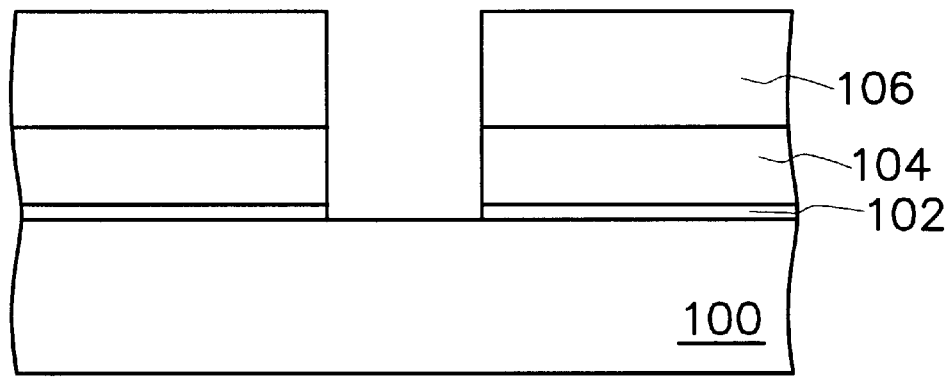
FIG. 1A to FIG. 1I are cross sectional views showing a fabrication process for forming a shallow trench isolation in a preferred embodiment according to the invention.

In FIG. 1A, a pad oxide layer 102 is formed on a substrate 100. The pad oxide layer 102 is formed to protect the substrate 100 from being damaged during the subsequent processes and is removed before forming a gate oxide layer. Preferably, the pad oxide layer 102 is formed by chemical vapor deposition (CVD) with a thickness of about 100 Å to 150 Å. A dielectric layer 104, for example, a silicon nitride layer with a thickness of about 1000 Å to 3000 Å, which is typically used as a hard mask layer is formed on the pad oxide layer 102. Using photolithography and etchings a patterned photo-resist layer 106 is formed on dielectric layer 104. Using, the photo-resist layer 106 as a mask, the dielectric layer 104 and the pad oxide layer 102 are etched to expose a part of the substrate 100.

Figure 1B:
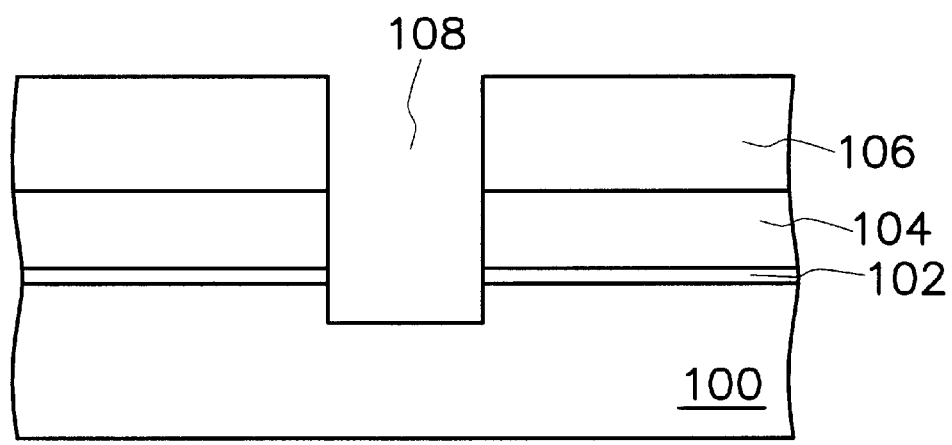

In FIG. 1B, using the photo-resist layer 106 as a mask, the substrate 100 is etched to form a trench 108 with a certain depth. The certain depth of the trench 108 can be a variable of a thickness of the dielectric layer 104. For example, if a shallow trench isolation with a depth of about 0.4 $\mu$m is to be formed, and the thickness of the dielectric layer 104 is about 3000 Å, this certain depth of the trench 108 is about 0.1 $\mu$m. If a shallow trench isolation with a depth ranged from about 0.2 $\mu$m to about 0.6 $\mu$m is to be formed, and the thickness of the dielectric layer is about 1000 Å to about 3000 Å, this certain depth is shallower then about 0.5 $\mu$m. It is appreciated that other parameters such as the dimensions of the devices to be formed on the substrate and the etching selectivity between the dielectric layer and the substrate are to be considered for determining the depth of the shallow trench isolation.

Figure 1C:
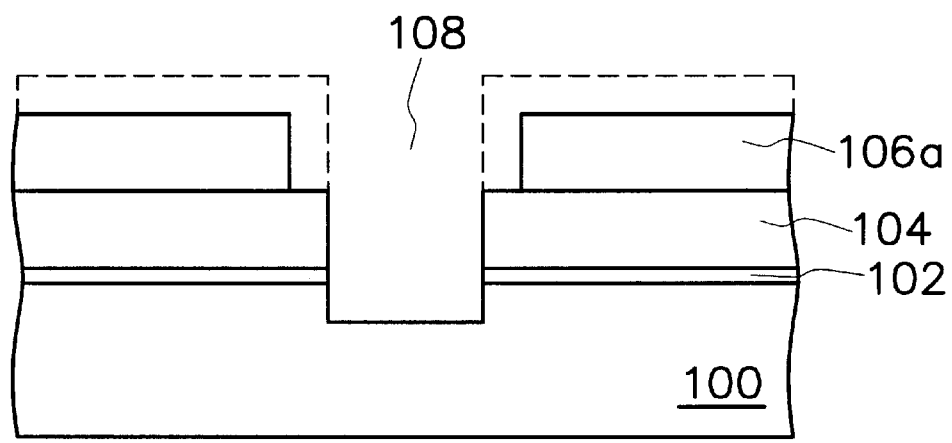

In FIG. 1C, the photo-resist layer 106 is eroded, for example, using oxygen plasma. The dielectric layer 103 at a periphery of the trench 108 is thus exposed. The eroded photo-resist layer is denoted as 106a.

Figure 1D:
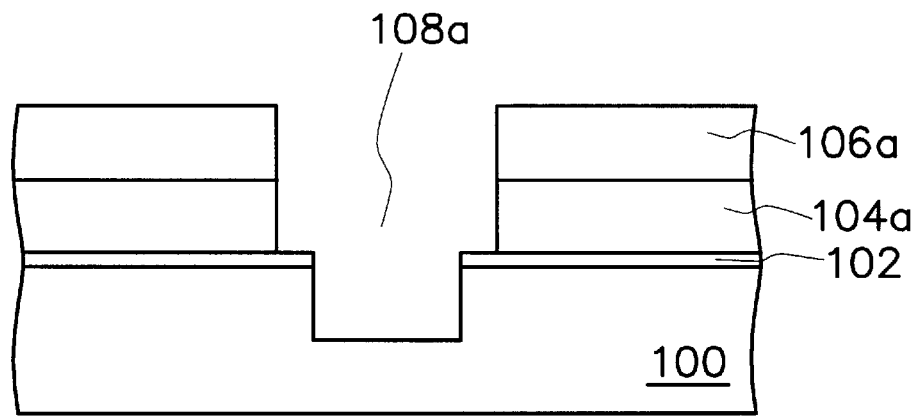

In FIG. 1D, using the photo-resist layer 106a as a mask, the exposed dielectric layer 104 is removed, for example, using oxygen plasma. If the dielectric layer 104 is made of silicon nitride an etching selectivity between silicon nitride and silicon is of about 1:1 by adjusting the content of oxygen plasma. While the exposed dielectric laser 104 is removed, the substrate 100 exposed by the trench 108 is further etched consequently. Therefore, the trench 108 is deepened as shown as 108a in FIG. 1D. Therefore, as mentioned above, the certain depth of the trench 108 has to be compromised with the thickness of the dielectric layer 104 and the etching selectivity between the dielectric layer 104 and the substrate 100.

Figure 1E:
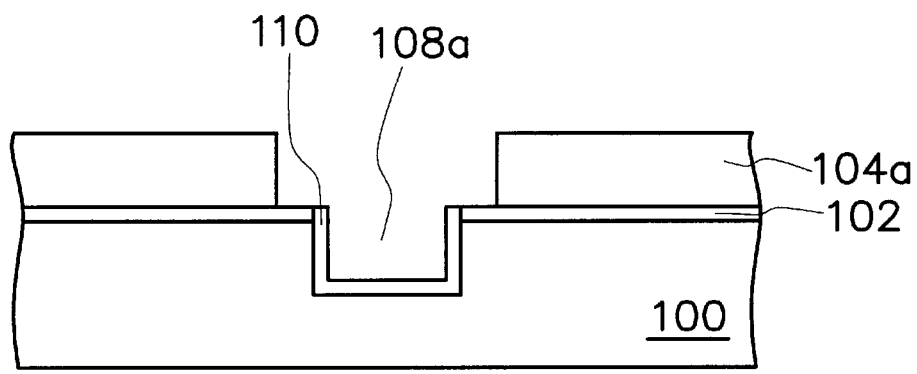

In FIG. 1E, the photo-resist layer 106a is removed. Typically, before the trench 108a is filled, a liner oxide layer 110 is formed along a surface of the substrate 100 exposed by the trench 108a. The liner oxide layer 110 can be formed, for example, by thermal oxidation with a thickness of about 150 Å to about 200 Å.

Figure 1F:
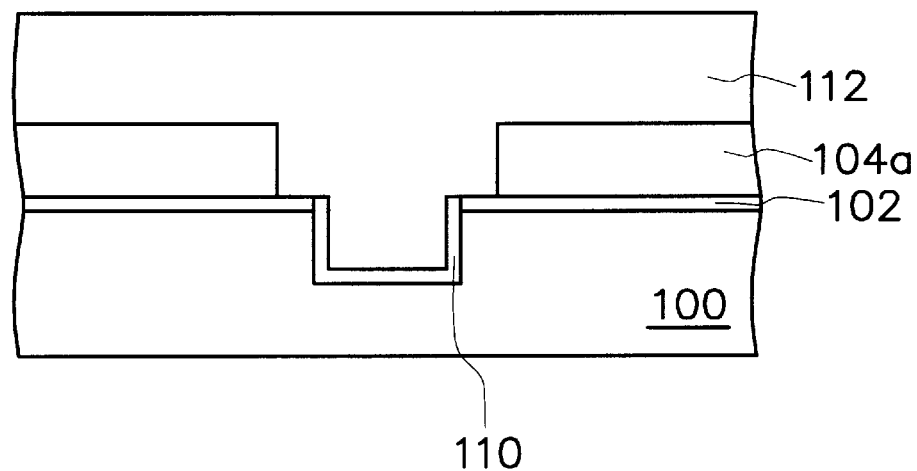

In FIG. 1F, an insulation layer 112, for example an oxide layer formed by atmosphere pressure CVD, is formed on the dielectric layer 104a to fill the trench 106. The insulation layer 112 has a thickness dependent on the specific depth of the trench 106 and the thickness of other layers such as the dielectric layer 104a. Preferably the thickness of the insulation layer 112 is ranged between 4000 Å to 11000 Å. A densification step is preferably performed under a temperature of about 1000° C. for about 10 to about 30 minutes. A densified insulation layer 112 is thus obtained.

Figure 1G:
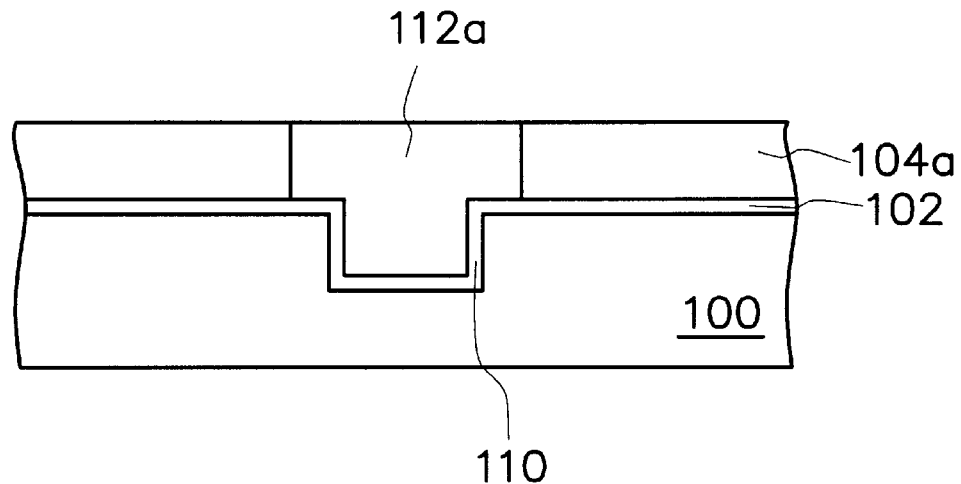

In FIG. 1G, using the dielectric layer 104a as a stop layer, the portion of the insulation layer 112 above the dielectric layer 104 is removed by chemical mechanical polishing to form an insulation plug 112a in the trench 108a and over the periphery of the trench 108a.

Figure 1H:
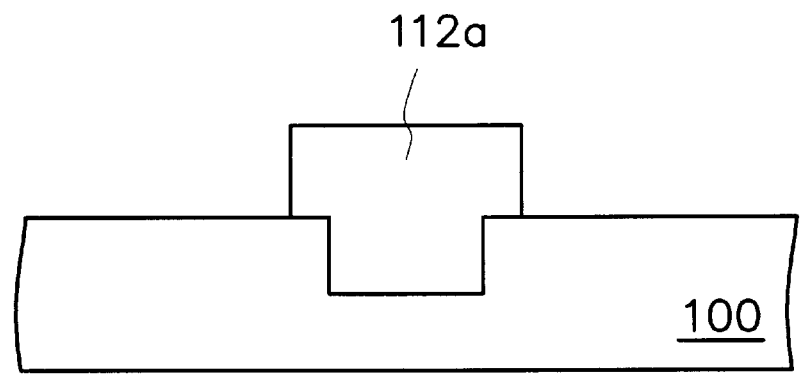

In FIG. 1H, the dielectric layer 104a is removed to expose the pad oxide layer 102 and a portion of the insulation plug 112a standing out of the pad oxide layer 102. In case that the dielectric layer 104 is made of silicon nitride, a hot phosphoric acid solution can be used for the removing step. As shown in the figure the insulation plug 112a has a T-shaped structure comprising a tilling part in the trench 108a and an extension part over the filling part and the periphery of the trench 108a over the substrate 100. Compared to the insulation plug disclosed by Fazan et al, the extension part has an effect to eliminate the corner effect equivalent to the function of the spacer. However, in the prior art disclosed by Fazan et al, the substrate is very likely to be damaged during the formation of the spacer. By the invention, the corner effect can be eliminated without the risk of damaging the substrate to cause any subsequent device failures or degradation.

Figure 1I:
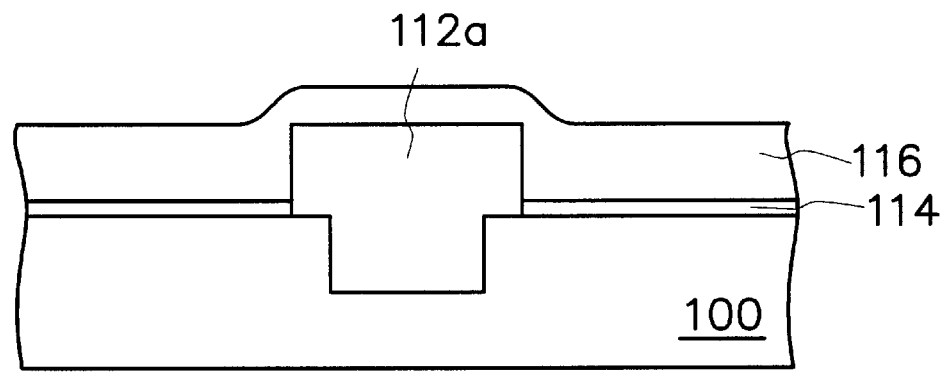

In FIG. 1I, using wet etching or plasma etching, the pad oxide layer 102 is removed to expose the substrate 100. As a consequence only the pad oxide layer 102a covered by the extension part of the insulation plug 112a is remained. Agate oxide layer 114 is formed on the substrate, followed by the formation of a gate material layer 116 on the gate oxide layer. A gate and other devices are then formed over the device by prior techniques.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of forming a shallow trench isolation comprising:

providing a substrate;

forming a pad oxide layer on the substrate;

forming a dielectric layer on the pad oxide layer;

forming a patterned photo-resist layer on the dielectric layer to expose a part of the dielectric layer;

removing a part of the exposed dielectric layer and a part of the pad oxide layer and a part of the substrate under the exposed part dielectric layer to form a trench in the substrate;

eroding the photo-resist layer to expose a part of the dielectric layer at a periphery of the trench over the substrate;

removing the dielectric layer exposed at the periphery of the trench and deepening the trench, so that the substrate at the periphery of the trench is exposed;

removing the photo-resist layers;

forming an insulation layer to cover the dielectric layer and the exposed substrate and to fill the trench;

etching back the insulation layer with the dielectric layer as a stop layer; and removing the dielectric layer.

2. The method according to claim 1, wherein the pad oxide layer has a thickness of about 100 Å to 150 Å.

3. The method according to claim 1, wherein the dielectric layer comprises a silicon nitride layer.

4. The method according to claim 1, wherein the dielectric layer has a thickness of about 1000 Å to 3000 Å.

5. The method according to claim 1, wherein the photo-resist layer is eroded by oxygen plasma.

6. The method according to claim 1, wherein the trench is deepened with a depth substantially equal to a thickness of the dielectric layer.

7. The method according to claim 1, comprising further a step of forming a liner oxide layer along a surface of the trench before the step of forming the insulation layer.

8. The method according to claim 7, wherein the liner oxide layer has a thickness of about 150 Å to 200 Å.

9. The method according to claim 1, wherein the insulation layer comprises an oxide layer.

10. The method according to claim 1, wherein the insulation layer has a thickness of about 9000 Å to about 11000 Å.

11. The method according to claim 1, comprising further the steps after the of forming the insulation layer and removing the dielectric layer:

removing the pad oxide layer to expose the substrate;

forming, a gate oxide layer on the substrate; and forming a gate material layer on the gate oxide layer.

12. The method according to claim 1, comprising further a step of densification after the formation of the insulation layer.

13. A method of forming a shallow trench isolation, comprising:

providing a substrate;

sequentially forming a pad oxide layer and a dielectric layer on the substrate;

removing a part of the pad oxide layer, the dielectric layer and the substrate to form a trench with a first depth in the substrate;

removing a part of the dielectric layer to further expose a portion of the pad oxide layer at a periphery of the trench, wherein the substrate is also significantly and simultaneously removed when the part of the dielectric layer is removed whereby the first depth of the trench is deepened to have an intended second depth;

forming a T-shaped insulation plug comprising a filling part to fill the trench and an extension part in the dielectric layer extending laterally to cover the exposed portion of the pad oxide layer at the periphery of the trench; and removing the dielectric layer and the pad oxide layer under the dielectric layer.

14. The method according to claim 13, wherein the pad oxide layer has a thickness of about 100 Å to 150 Å.

15. The method according to claim 13, wherein the dielectric layer comprises a silicon nitride layer.

16. The method according to claim 13, wherein the dielectric layer has a thickness of about 1000 Å to 3000 Å.

17. The method according to claim 13, comprising further a step of forming a liner oxide layer along a surface of the trench before the step of forming the insulation layer.

18. The method according to claim 13, wherein the step of removing the part of the pad oxide layer, the dielectric layer and the substrate comprises performing a first etching process using a photoresist layer with an opening as an etching mask, and the step of removing the part of the dielectric layer to further expose the portion of the pad oxide layer at the periphery of the trench comprises performing a second etching process using the same photoresist layer as an etching mask but the photoresist layer is eroded to widen the opening before performing the second etching process.

19. The method according to claim 13, wherein in the step of removing the part of the dielectric layer to further expose the portion of the pad oxide layer at the periphery of the trench, a selective removing ratio between the substrate and the dielectric layer is chosen based on a thickness of the dielectric layer.

20. The method according to claim 19, wherein the selective removing ratio between the dielectric layer and the substrate is about 1:1.

* * * * *